United States Patent
In et al.

(10) Patent No.: US 11,694,626 B2
(45) Date of Patent: Jul. 4, 2023

(54) SCAN DRIVER AND DRIVING METHOD THEREOF

(71) Applicant: Samsung Display Co., Ltd., Yongin-si (KR)

(72) Inventors: Hai Jung In, Yongin-si (KR); Soon Gi Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/504,364

(22) Filed: Oct. 18, 2021

(65) Prior Publication Data

US 2022/0199030 A1 Jun. 23, 2022

(30) Foreign Application Priority Data

Dec. 17, 2020 (KR) .................. 10-2020-0177881

(51) Int. Cl.
*G09G 3/3266* (2016.01)
*G09G 3/3233* (2016.01)
*G09G 3/36* (2006.01)

(52) U.S. Cl.
CPC ......... *G09G 3/3266* (2013.01); *G09G 3/3233* (2013.01); *G09G 3/3677* (2013.01); *G09G 2310/0286* (2013.01); *G09G 2310/08* (2013.01)

(58) Field of Classification Search
CPC ............... G09G 3/3233; G09G 3/3677; G09G 2310/0286; G09G 2310/08; G09G 3/3266
See application file for complete search history.

(56) References Cited

U.S. PATENT DOCUMENTS

| | | | |
|---|---|---|---|
| 10,453,386 B2 | 10/2019 | Jang | |
| 10,706,784 B2 | 7/2020 | Kim et al. | |
| 2012/0001955 A1* | 1/2012 | Yamazaki | G09G 3/3688 345/87 |
| 2018/0286302 A1* | 10/2018 | Feng | G09G 3/3677 |
| 2019/0347997 A1 | 11/2019 | Park et al. | |
| 2021/0366402 A1 | 11/2021 | In et al. | |
| 2021/0383760 A1 | 12/2021 | In | |
| 2022/0028323 A1 | 1/2022 | In | |

FOREIGN PATENT DOCUMENTS

| | | |
|---|---|---|
| KR | 10-2019-0009019 | 1/2019 |
| KR | 10-2019-0128760 | 11/2019 |
| KR | 10-2021-0143979 | 11/2021 |
| KR | 10-2021-0152085 | 12/2021 |
| KR | 10-2022-0014407 | 2/2022 |

* cited by examiner

*Primary Examiner* — Stacy Khoo

(74) *Attorney, Agent, or Firm* — H.C. Park & Associates, PLC

(57) ABSTRACT

A scan driver and a driving method thereof, in which the scan driver includes a plurality of stages outputting an output signal in response to clock signals supplied at a first frequency during a driving time of one frame, wherein the plurality of stages are supplied with the clock signals at a second frequency lower than the first frequency during a hold time of the one frame that is separate from the driving time of the one frame.

18 Claims, 11 Drawing Sheets

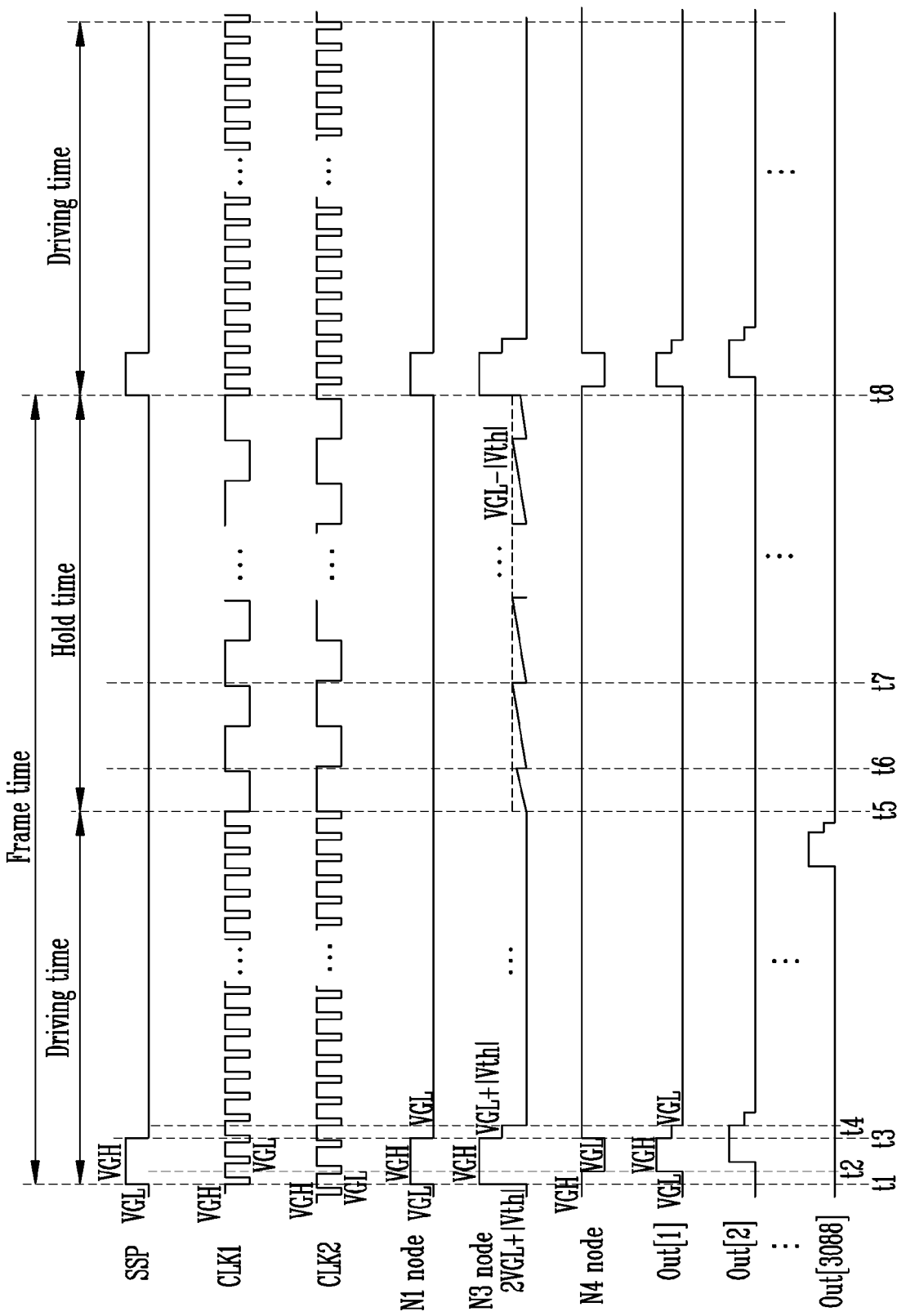

SCAN DRIVER AND DRIVING METHOD THEREOF

CROSS-REFERENCE TO RELATED APPLICATION

This application claims priority from and the benefit of Korean Patent Application No. 10-2020-0177881, filed on Dec. 17, 2020, which is hereby incorporated by reference for all purposes as if fully set forth herein.

BACKGROUND OF THE INVENTION

Field

Embodiments of the invention relate to a scan driver and a driving method thereof, and more particularly, to a scan driver and a driving method thereof that may constantly maintain an output voltage of the scan driver to reduce power consumption.

Discussion of the Background

Generally, a display device includes a data driver for supplying a data signal to data lines, a scan driver for supplying a scan signal to scan lines, an emission driver for supplying an emission control signal to emission control lines, and pixels that are disposed to be connected to the data lines, the scan lines, and the emission control lines.

In order to reduce power consumption of the display device, the scan driver is driven by reducing a driving frequency in a conventional typical fixed frequency driving method.

However, when the driving frequency of the scan driver is reduced to reduce the power consumption, a clock signal inputted to the scan driver is maintained at a fast frequency during a hold time in which a start pulse is not inputted.

The above information disclosed in this Background section is only for understanding of the background of the inventive concepts, and, therefore, it may contain information that does not constitute prior art.

SUMMARY OF THE INVENTION

Devices constructed/methods according to embodiments and implementations of embodiments of the invention are capable of reducing a frequency applied to a scan driver during a portion of a frame in order to save on power consumption of a display device that includes the scan driver.

An embodiment is to solve the above-described problem, and to provide a scan driver that may reduce a driving frequency of the scan driver to provide a clock signal inputted to the scan driver at a low frequency during a hold time of a frame in which no start pulse is inputted to the scan driver.

Additional features of the inventive concepts will be set forth in the description which follows, and in part will be apparent from the description, or may be learned by practice of the inventive concepts.

An embodiment provides a scan driver including: an input portion controlling a first node and a second node based on signals supplied to a first input terminal, a second input terminal, and a third input terminal; a first signal processing portion that supplies a voltage of a second power source to a fourth node based on a voltage of the first node, or electrically connects the second node and the fourth node through a fifth node based on a voltage of a first power source; a second signal processing portion that includes a fourteenth transistor connected between a third node and a sixth node, and is connected to the first input terminal, the second input terminal, and the first power source to control the third node based on an operation of the fourteenth transistor; and an output portion that controls the voltage applied to the third node to be less than or equal to the voltage of the first power source, and supplies the voltage of the first power source or the voltage of the second power source to an output terminal as a scan signal based on a voltage of the third node and a voltage of the fourth node.

The scan driver may supply the scan signal to the output terminal during a plurality of frame times and hold times; each of the frame times has a constant frequency; the voltage of the first power source or the voltage of the second power source may be supplied to the output terminal by using a first clock signal supplied from the second input terminal and a second clock signal supplied from the third input terminal; and in each of the hold times, the voltage of the first power source may be supplied to the output terminal by using the first clock signal and the second clock signal having the same voltage level as the voltage of the second power source.

The hold time may include a first hold time and a second hold time; in the first hold time, the voltage of the third node may be maintained at twice the voltage of the first power source; and in the second hold time, the voltage of the third node may rise from twice the voltage of the first power source to the voltage of the first power source or less.

The output portion may include: a ninth transistor that is connected between the second power source and the output terminal, and of which a gate electrode receives the voltage of the fourth node; and a tenth transistor that is connected between the output terminal and the first power source, and of which a gate electrode receives the voltage of the third node.

The input portion may include: a first transistor that is connected between the first input terminal and the first node, and of which a gate electrode is connected to the second input terminal to receive the first clock signal; a fourth transistor that is connected between the first node and the second node, and of which a gate electrode receives the voltage of the first node; and a fifth transistor that is connected to the second node and the first power source, and of which a gate electrode is connected to the second input terminal to receive the first clock signal.

The first signal processing portion may include: a second capacitor having one end connected to the fifth node and the other end connected to a first electrode of a sixth transistor; a seventh transistor that is connected between the first electrode of the sixth transistor and the third input terminal, and of which a gate electrode receives a voltage of the fifth node; a sixth transistor that is connected between a first electrode of the seventh transistor and the fourth node, and of which a gate receives the second clock signal output from the third input terminal; a first capacitor having one end connected to the fourth node and the other end connected to the second power source; a fourth capacitor having one end connected to the first node and the other end connected to the second power source; an eighth transistor that is connected to the fourth node and the second power source, and of which a gate electrode receives the voltage of the first node; and a thirteenth transistor that is connected to the first node and the second power source, and of which a gate electrode is connected to a reset power source.

The second signal processing portion may include: a fifteenth transistor that is connected between the first input terminal and a sixteenth transistor, and of which a gate receives a first clock signal output from the second input terminal; a sixteenth transistor that is connected between the fifteenth transistor and the sixth node, and of which a gate electrode receives the voltage of the first power source; a third transistor that is connected between the third input terminal and a seventh node, and of which a gate electrode receives a voltage of the sixth node; a third capacitor having one end connected to the sixth node and the other end connected to the seventh node; and a second transistor that is connected to the seventh node and the second power source, and of which a gate electrode receives a voltage of the second node.

The scan driver may further include a stabilizing portion that is electrically connected between the input portion and the output portion, and that may limit a voltage drop amount of the first node and a voltage drop amount of the second node.

The stabilizing portion may include an eleventh transistor that is connected between the second node and the fifth node, and of which a gate electrode receives the voltage of the first power source, and a seventeenth transistor that is connected between the first node and a twelfth transistor, and of which a gate electrode receives the voltage of the first power source; and the twelfth transistor is connected between the seventeenth transistor and the third node, and is provided with a gate electrode receiving the voltage of the first power source.

The scan driver may further include a fifth capacitor having one end connected to the third node and the other end connected to the first power source, and the fifth capacitor stores the voltage of the third node during a second hold time.

The scan driver may supply the scan signal to the output terminal during a plurality of frame times and hold times; the frame time has a constant frequency; the voltage of the first power source or the voltage of the second power source is supplied to the output terminal by using a first clock signal supplied from the second input terminal and a second clock signal supplied from the third input terminal; each of the hold times includes a third hold time to an n-th hold time and has a frequency lower than the frequency of the frame time, and the voltage of the first power source is supplied to the output terminal by using the first clock signal supplied from the second input terminal and/or the second clock signal supplied from the third input terminal.

In the third hold time, the first clock signal may have a voltage level of the same low level as the voltage of the first power source, the second clock signal may have a voltage level of the same high level as the voltage of the second power source, and the voltage of the third node may rise from twice the voltage of the first power source to the voltage of the first power source or less.

In the fourth hold time to an n-th hold time, the first clock signal may be changed from a high level voltage level to a low level voltage level, the second clock signal may be changed from a low level voltage level to a high level voltage level, and the voltage of the third node may rise from twice the voltage of the first power source to the voltage of the first power source or less.

The output portion may include: a ninth transistor that is connected between the second power source and the output terminal, and of which a gate electrode receives the voltage of the fourth node; and a tenth transistor that is connected between the output terminal and the first power source, and of which a gate electrode receives the voltage of the third node.

The input portion may include: a first transistor that is connected between the first input terminal and the first node, and of which a gate electrode is connected to the second input terminal to receive the first clock signal; a fourth transistor that is connected between the first node and the second node, and of which a gate electrode receives the voltage of the first node; and a fifth transistor that is connected to the second node and the first power source, and of which a gate electrode is connected to the second input terminal to receive the first clock signal.

The first signal processing portion may include: a second capacitor having one end connected to the fifth node and the other end connected to a first electrode of a sixth transistor; a seventh transistor that is connected between the first electrode of the sixth transistor and the third input terminal, and of which a gate electrode receives a voltage of the fifth node; a sixth transistor that is connected between a first electrode of the seventh transistor and the fourth node, and of which a gate receives the second clock signal output from the third input terminal; a first capacitor having one end connected to the fourth node and the other end connected to the second power source; a fourth capacitor having one end connected to the first node and the other end connected to the second power source; an eighth transistor that is connected to the fourth node and the second power source, and of which a gate electrode receives the voltage of the first node; and a thirteenth transistor that is connected to the first node and the second power source, and of which a gate electrode is connected to a reset power source.

The second signal processing portion may include: a fifteenth transistor that is connected between the first input terminal and a sixteenth transistor, and of which a gate receives a first clock signal output from the second input terminal; a sixteenth transistor that is connected between the fifteenth transistor and the sixth node, and of which a gate electrode receives the voltage of the first power source; a third transistor that is connected between the third input terminal and a seventh node, and of which a gate electrode receives a voltage of the sixth node; a third capacitor having one end connected to the sixth node and the other end connected to the seventh node; and a second transistor that is connected to the seventh node and the second power source, and of which a gate electrode receives a voltage of the second node.

The scan driver may further include a stabilizing portion that is electrically connected between the input portion and the output portion, and limits a voltage drop amount of the first node and a voltage drop amount of the second node.

The stabilizing portion may include: an eleventh transistor that is connected between the second node and the fifth node, and of which a gate electrode receives the voltage of the first power source; and a twelfth transistor that is connected between the first node and the third node, and of which a gate electrode receive the voltage of the first power source.

The scan driver may further include a fifth capacitor having one end connected to the third node and the other end connected to the first power source, and the fifth capacitor may store the voltage of the third node during a third hold time to an n-th hold time.

According to the scan driver of the embodiment, it is possible to reduce a driving frequency of the scan driver so that a scan signal having a constant voltage level is output from the scan driver during a hold time in which no start pulse is inputted.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 9B illustrates a timing diagram of an operation of the stage of FIG. 9A.

DETAILED DESCRIPTION OF THE EMBODIMENTS

Figure 1:
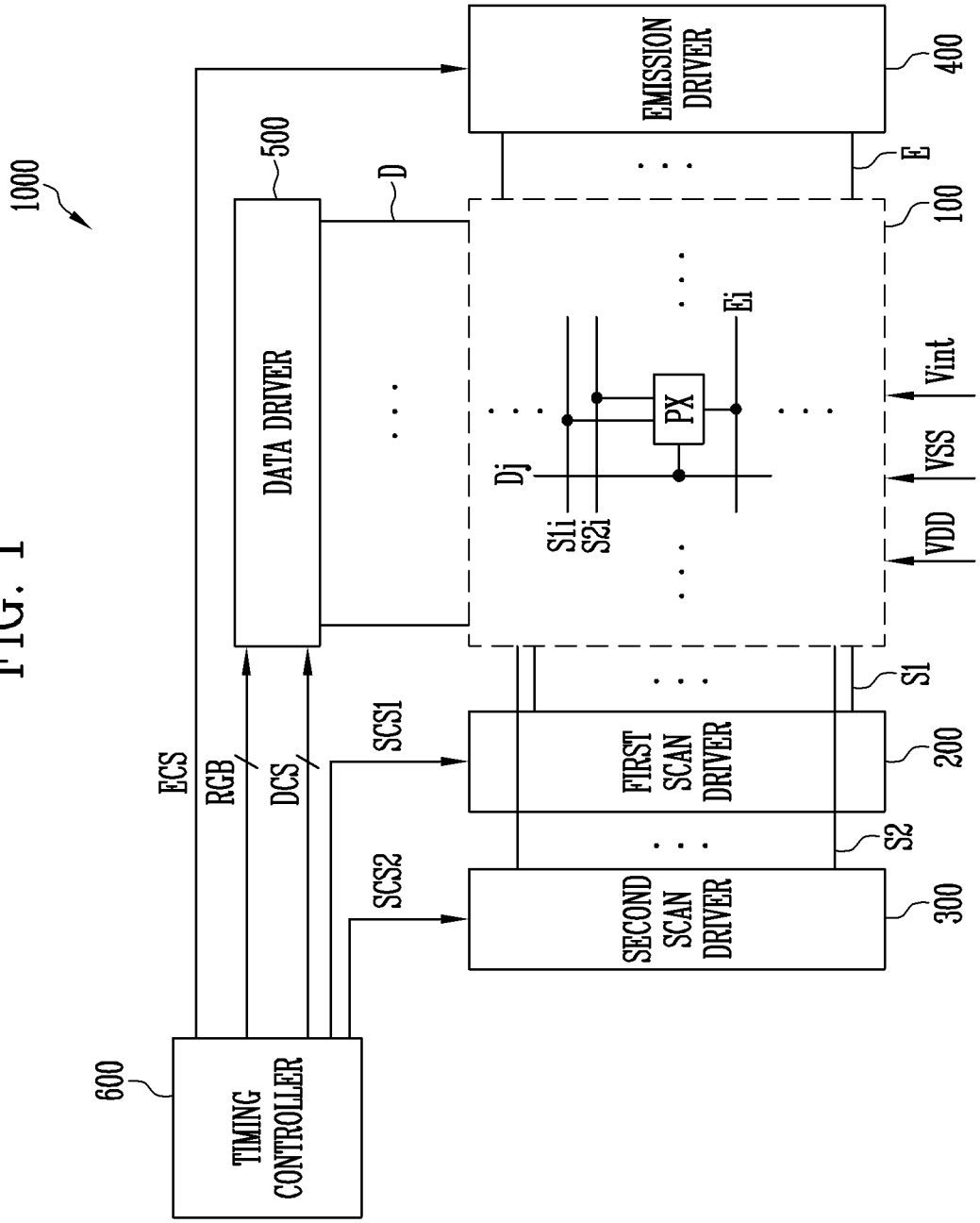
FIG. 1 illustrates a schematic view for explaining a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment will be described with reference to FIG. 1.

FIG. 1 illustrates a schematic view for explaining a display device according to an embodiment that is constructed according to principles of the invention.

A display device 1000 may include a display part 100, a first scan driver 200, a second scan driver 300, an emission driver 400, a data driver 500, and a timing controller 600.

The display device 1000 may display an image at various driving frequencies (or image refresh rates, screen refresh rates, etc.) according to driving conditions. In this case, the driving frequency is a frequency at which a data signal is substantially written to a driving transistor of a pixel PX.

Specifically, the driving frequency is also referred to as a screen refresh rate, and represent a frequency at which an image is displayed on a display screen.

For example, the display device 1000 may display an image in response to various driving frequencies of from 1 Hz to 120 Hz.

The display part 100 displays an image. The display part 100 includes the pixels PX disposed to be connected to data lines D, scan lines S1 and S2, and emission control lines E. In this case, the pixels PX may receive voltages of a first driving power source VDD, a second driving power source VSS, and an initializing power source Vint external to the display device 1000.

In addition, the pixels PX may be connected to one or more of the first scan line S1, the second scan line S2, and the emission control line E corresponding to a pixel circuit structure.

The timing controller 600 may receive an input control signal and an input image signal from an image source such as an external graphic device.

Specifically, the timing controller 600 may generate image data RGB according to an operating condition of the display part 100 based on the input image signal to provide it to the data driver 500.

In addition, the timing controller 600 may generate a first driving control signal SCS1 for controlling driving timing of the first scan driver 200 based on the input control signal to provide it to the first scan driver 200.

In addition, the timing controller 600 may provide a second driving control signal SCS2 for controlling driving timing of the second scan driver 300 based on the input control signal to the second scan driver 300.

In addition, the timing controller 600 may generate a third driving control signal ECS for controlling driving timing of the emission driver 400 based on the input control signal to provide it to the emission driver 400.

In addition, the timing controller 600 may generate a fourth driving control signal DCS for controlling driving timing of the data driver 500 based on the input control signal to provide it to the data driver 500.

The first scan driver 200 may receive the first driving control signal SCS1 from the timing controller 600. In addition, the first scan driver 200 may supply a scan signal to the first scan lines S1 in response to the first driving control signal SCS1.

The second scan driver 300 may receive the second driving control signal SCS2 from the timing controller 600. In addition, the second scan driver 300 may supply a scan signal to the second scan lines S2 in response to the second driving control signal SCS2.

The emission driver 400 may receive the third driving control signal ECS from the timing controller 600. In addition, the emission driver 400 may supply an emission control signal to the emission control lines E in response to the third driving control signal ECS.

The data driver 500 may receive the fourth driving control signal DCS from the timing controller 600. In addition, the data driver 500 may convert the image data RGB into an analog data signal (data voltage) in response to the fourth driving control signal DCS, and supply the data signal to the data lines D.

Hereinafter, a circuit diagram of a pixel included in the display device according to the embodiment will be described with reference to FIG. 2.

Figure 2:
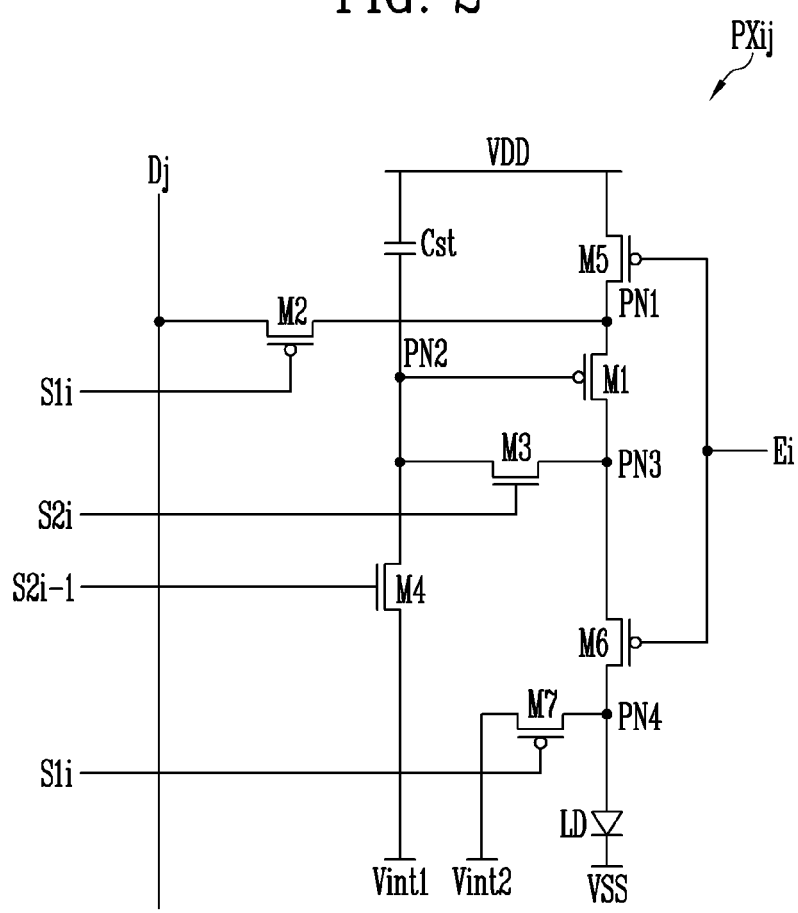
FIG. 2 illustrates a circuit diagram of an example of a pixel included in the display device of FIG. 1 according to an embodiment.

FIG. 2 illustrates a circuit diagram of an example of a pixel included in the display device of FIG. 1 according to an embodiment.

In FIG. 2, for better comprehension and ease of description, a pixel PXij disposed at an i-th horizontal line (or an i-th pixel row) and connected to a j-th data line Dj is illustrated (wherein, i and j are integer values greater than or equal to 1).

Referring to FIG. 2, the pixel PXij may include a light emitting element LD, first to seventh pixel transistors M1 to M7, and a storage capacitor Cst.

A first electrode of the light emitting element LD is connected to a fourth pixel node PN4, and a second electrode thereof is connected to the second driving power source VSS. In this case, the light emitting element LD emits light having a predetermined luminance corresponding to an amount of current supplied from the first pixel transistor M1.

In the embodiment, the light emitting element LD may be an organic light emitting diode (OLED) including an organic light emitting layer. Alternatively, the light emitting element LD may be an inorganic light emitting element made of an inorganic material. In addition, the light emitting element LD may be a light emitting element complexly made of an inorganic material and an organic material. Alternatively, the light emitting element LD may have a form in which a plurality of inorganic light emitting elements are connected in parallel and/or in series between the second driving power source VSS and the fourth pixel node PN4.

The first pixel transistor M1 is connected between a first pixel node PN1 and a third pixel node PN3. In this case, a gate electrode of the first pixel transistor M1 is connected to a second pixel node PN2.

The first pixel transistor M1 may control an amount of current flowing from the first driving power source VDD to the second driving power source VSS via the light emitting element LD in response to a voltage of the second pixel node PN2. In this case, the first driving power source VDD may be set to a higher voltage than that of the second driving power source VSS.

The second pixel transistor M2 is connected between the data line Dj and the first pixel node PN1. In addition, a gate electrode of the second pixel transistor M2 is connected to an i-th first scan line S1i.

Specifically, the second pixel transistor M2 is turned on when the first scan signal is supplied to the i-th first scan line S1i to electrically connect the data line Dj and the first pixel node PN1.

The third pixel transistor M3 is connected between the third pixel node PN3 and the second pixel node PN2. In addition, a gate electrode of the third pixel transistor M3 is connected to an i-th second scan line S2i.

Specifically, the third pixel transistor M3 is turned on when the second scan signal is supplied to the i-th second scan line S2i. In this case, the third pixel transistor M3 is turned on, so that the first pixel transistor M1 is diode-connected.

The fourth pixel transistor M4 is connected between the second pixel node PN2 and a first initializing power source Vint1.

Specifically, a gate electrode of the fourth pixel transistor M4 is turned on when the second scan signal is supplied to an (i−1)-th second scan line S2i−1 to supply a voltage of the first initializing power source Vint1 to the second pixel node PN2. In this case, the voltage of the first initializing power source Vint1 is set to a voltage lower than that of a data signal supplied to the data line Dj.

Accordingly, the gate voltage of the first pixel transistor M1 (that is, the voltage of the second pixel node PN2) is initialized to the voltage of the first initializing power source Vint1 by the turn-on of the fourth pixel transistor M4.

The fifth pixel transistor M5 is connected between the first driving power source VDD and the first pixel node PN1. In addition, a gate electrode of the fifth pixel transistor M5 is connected to an i-th emission control line Ei.

The sixth pixel transistor M6 is connected between the third pixel node PN3 and the first electrode (that is, the fourth pixel node PN4) of the light emitting element LD. In addition, a gate electrode of the sixth pixel transistor M6 is connected to the i-th emission control line Ei.

Specifically, the fifth pixel transistor M5 and the sixth pixel transistor M6 may be turned off when an emission control signal is supplied to the i-th emission control line Ei, and turned on in other cases.

The seventh pixel transistor M7 is connected between the first electrode (that is, the fourth pixel node PN4) of the light emitting element LD and a second initializing power source Vint2. In addition, a gate electrode of the seventh pixel transistor M7 is connected to the i-th first scan line S1i.

Specifically, when the first scan signal is supplied to the i-th first scan line S1i, the seventh pixel transistor M7 is turned on to supply a voltage of the second initializing power source Vint2 to the first electrode of the light emitting element LD.

However, this is merely an example, and the gate electrode of the seventh pixel transistor M7 may be connected to the (i−1)-th first scan line S1i−1 or the (i+1)-th first scan line S1i+1.

The storage capacitor Cst is connected between the first driving power source VDD and the second pixel node PN2. In this case, the storage capacitor Cst may store the voltage applied to the second pixel node PN2.

Meanwhile, the first pixel transistor M1, the second pixel transistor M2, the fifth pixel transistor M5, the sixth pixel transistor M6, and the seventh pixel transistor M7 may be formed as a polysilicon semiconductor transistor.

For example, the first pixel transistor M1, the second pixel transistor M2, the fifth pixel transistor M5, the sixth pixel transistor M6, and the seventh pixel transistor M7 may include a poly-silicon semiconductor layer formed through a low temperature poly-silicon (LTPS) process as an active layer (channel). In addition, the first pixel transistor M1, the second pixel transistor M2, the fifth pixel transistor M5, the sixth pixel transistor M6, and the seventh pixel transistor M7 may be P-type transistors.

Accordingly, a gate-on voltage that turns on the first pixel transistor M1, the second pixel transistor M2, the fifth pixel transistor M5, the sixth pixel transistor M6, and the seventh pixel transistor M7 may be a low level (or a logic low level).

Since the poly-silicon semiconductor transistor has an advantage of a fast response speed, it may be applied to a switching element requiring fast switching.

The third and fourth pixel transistors M3 and M4 may be formed as an oxide semiconductor transistor. For example, the third and fourth pixel transistors M3 and M4 may be an N-type oxide semiconductor transistor, and may include an oxide semiconductor layer as an active layer. Accordingly, the gate-on voltage that turns on the third and fourth pixel transistors M3 and M4 may be a high level (or a logic high level).

The oxide semiconductor transistor may be processed at a low temperature, and has lower charge mobility than that of the poly-silicon semiconductor transistor. That is, the oxide semiconductor transistor has an excellent off-current characteristic. Accordingly, when the third pixel transistor M3 and the fourth pixel transistor M4 are formed as the oxide semiconductor transistor, a leakage current from the second pixel node PN2 and/or the third pixel node PN3 may be minimized, thereby improving display quality.

In addition, each of the second scan lines S2i–1 and S2i may be commonly connected to two or more horizontal lines other than the i-th horizontal line. Accordingly, an initializing operation of and/or a threshold voltage compensating operation of the gate voltage of the first pixel transistors M1 of the pixels disposed on the plurality of horizontal lines may be simultaneously performed.

Hereinafter, a timing diagram for driving of the pixel of FIG. 2 according to the embodiment will be described with reference to FIG. 3.

Figure 3:
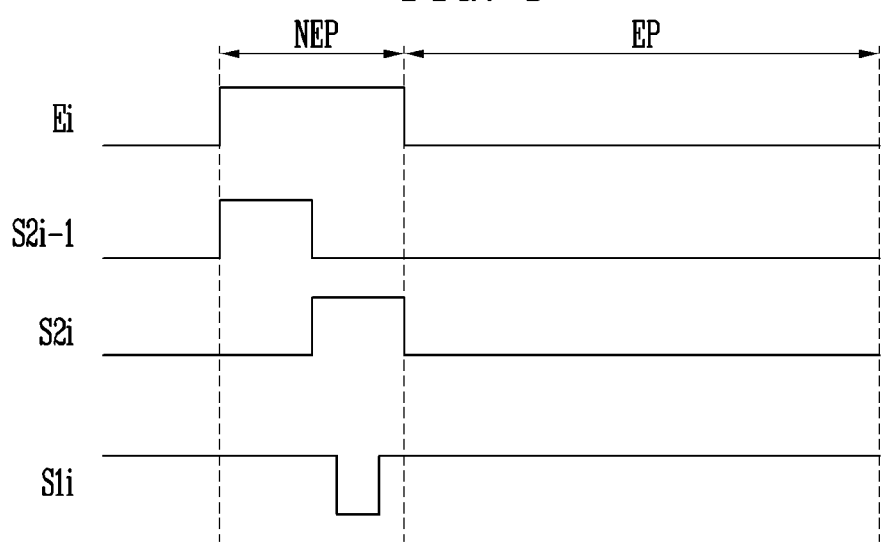
FIG. 3 illustrates a timing diagram for driving of the pixel of FIG. 2 according to an embodiment.

FIG. 3 illustrates a timing diagram for driving of the pixel of FIG. 2 according to the embodiment.

Referring to FIG. 1 to FIG. 3, the pixel PXij may receive signals for displaying an image in a non-emission period NEP, and emit light based on the received signals in an emission period EP.

Referring to FIG. 3, a gate-on voltage of the second scan signal supplied to the i-th second scan lines S2i connected to the third and fourth pixel transistors M3 and M4, which are N-type transistors, is a high level.

A gate-on voltage of the first scan signal supplied to the i-th first scan line S1i connected to the second and seventh transistors M2 and M7, which are P-type transistors, is a low level.

In addition, a gate-on voltage of the emission control signal supplied to the i-th emission control line Ei connected to the fifth and sixth pixel transistors M5 and M6, which are P-type transistors, is a low level.

First, the emission control signal of a high level is supplied to the i-th emission control line Ei during the non-emission period NEP. In this case, the fifth pixel transistor M5 and the sixth pixel transistor M6 are turned off. When the fifth and sixth pixel transistors M5 and M6 are turned off, the pixel PXij is set to the non-emission state.

Thereafter, a second scan signal is supplied to the (i–1)-th second scan line S2i–1. When the second scan signal is supplied to the (i–1)-th second scan line S2i–1, the fourth pixel transistor M4 is turned on. In addition, when the fourth pixel transistor M4 is turned on, the voltage of the first initializing power source Vint1 is supplied to the second pixel node PN2.

Thereafter, the first and second scan signals are respectively supplied to the i-th first scan line S1i and the i-th second scan line S2i.

Specifically, when the second scan signal is supplied to the i-th second scan line S2i, the third pixel transistor M3 is turned on. In this case, when the third pixel transistor M3 is turned on, the first pixel transistor M1 is diode-connected, and a threshold voltage of the first pixel transistor M1 may be compensated.

Thereafter, when the first scan signal is supplied to the i-th first scan line S1i, the second pixel transistor M2 is turned on. In this case, when the second pixel transistor M2 is turned on, the data signal from the data line Dj is supplied to the first pixel node PN1.

Specifically, since the second pixel node PN2 is initialized with the voltage of the first initializing power source Vint1 lower than the data signal, the first pixel transistor M1 is turned on.

In this case, when the first pixel transistor M1 is turned on, the data signal supplied to the first pixel node PN1 is supplied to the second pixel node PN2 via the diode-connected first pixel transistor M1. Then, a data signal, and a voltage corresponding to the threshold voltage of the first pixel transistor M1 are applied to the second pixel node PN2. In this case, the storage capacitor Cst may store the voltage of the second pixel node PN2.

In addition, when the first scan signal is supplied to the i-th first scan line S1i, the seventh pixel transistor M7 is turned on. In this case, when the seventh pixel transistor M7 is turned on, the voltage of the second initializing power source Vint2 is supplied to the first electrode (that is, the fourth pixel node PN4) of the light emitting element LD. Accordingly, a residual voltage remaining in a parasitic capacitor of the light emitting element LD may be discharged.

Thereafter, the supply of the emission control signal to the i-th emission control line Ei is stopped. When the supply of the emission control signal to the i-th emission control line Ei is stopped, the fifth and sixth pixel transistors M5 and M6 are turned on.

In this case, the first pixel transistor M1 may control a driving current flowing to the light emitting element LD in response to the voltage of the second pixel node PN2. Thus, the light emitting element LD may emit light having a luminance corresponding to an amount of the current.

Hereinafter, a scan driver according to an embodiment will be described with reference to FIG. 4.

Figure 4:
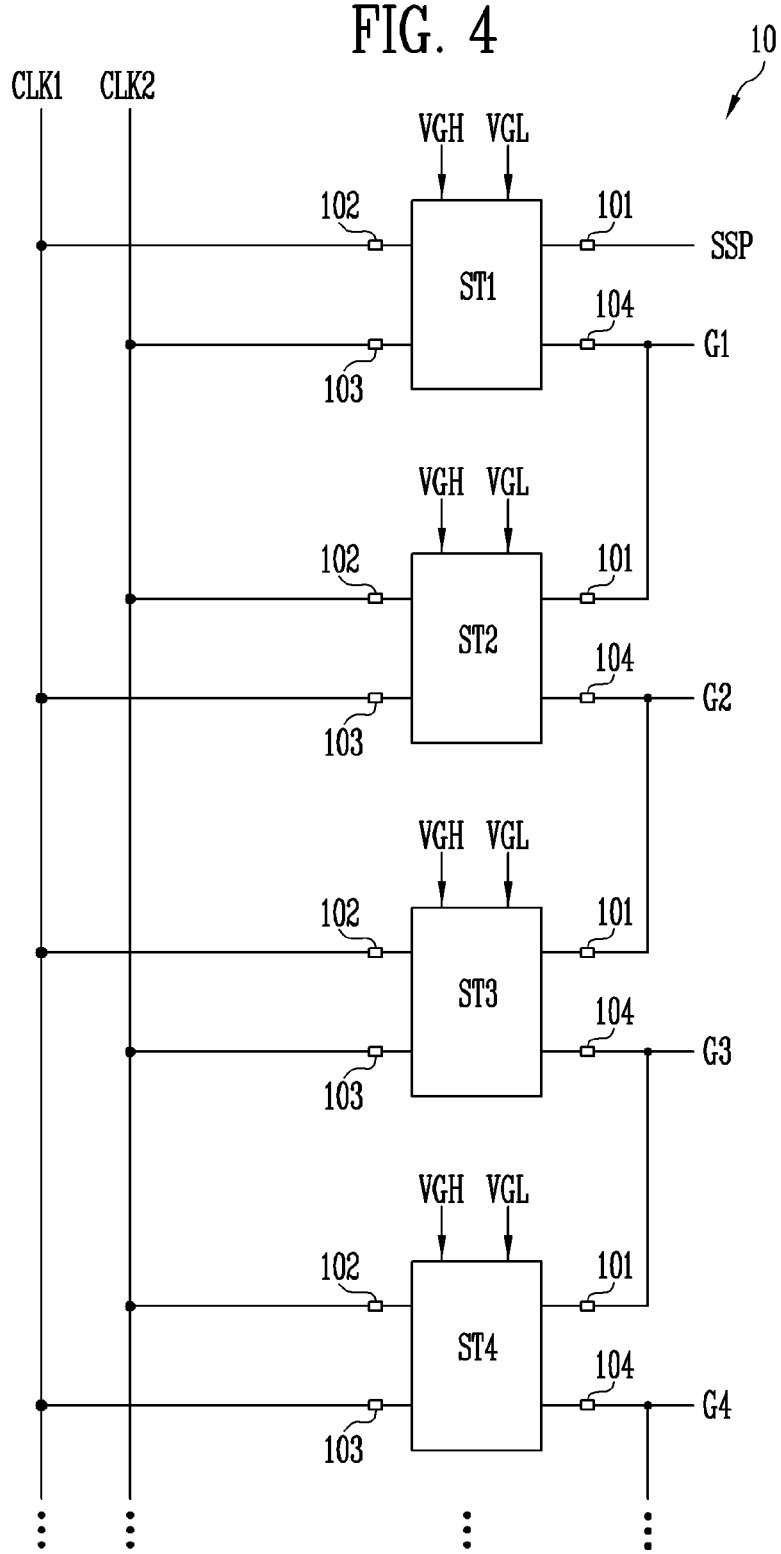
FIG. 4 illustrates a block diagram of a scan driver according to an embodiment.

FIG. 4 illustrates a block diagram of a scan driver according to an embodiment.

Referring to FIG. 1 and FIG. 4, a scan driver 10 may include a plurality of stages ST1 to ST4.

Specifically, the plurality of stages ST1 to ST4 may be connected to each of predetermined output lines G1 to G4, and may output output signals corresponding to clock signals CLK1 and CLK2. In this case, the stages ST1 to ST4 may be implemented with substantially the same circuit.

In this case, the scan driver 10 may configure the emission driver 400 and/or the second scan driver 300 described with reference to FIG. 1. For example, the output lines G1 to G4 may be understood as emission control lines (E in FIG. 1) or second scan lines (S2 in FIG. 1).

According to the embodiment, the first to fourth stages ST1 to ST4 may be connected to at least one of the output lines G1 to G4, respectively.

Specifically, the first stage ST1 may be connected to the first output line G1 to supply an output signal (for example, second scan signal or light emission control signal) to the first output line G1. However, this is merely an example, and the connection relationship between the output lines G1 to G4 and the horizontal lines may be variously set according to the pixel structure and the driving method of the display device 1000.

For example, the first output line G1 connected to the first stage ST1 may be commonly connected to a plurality of horizontal lines (or pixel rows).

Each of the stages ST1 to ST4 may be provided with a first input terminal 101, a second input terminal 102, a third input terminal 103, and an output terminal 104.

Specifically, the first input terminal 101 may receive an output signal of a previous stage (for example, emission control signal or second scan signal) or a start pulse SSP (for example, emission control start pulse or second scan start pulse).

For example, the first input terminal 101 of the first stage ST1 may receive the start pulse SSP, and the first input terminal 101 of the second stage ST2 may receive an output signal output from the first stage ST1.

In addition, the second input terminal 102 of a k-th stage (k is an integer value greater than or equal to 1) may receive the first clock signal CLK1, and the third input terminal 103 thereof may receive the second clock signal CLK2.

Further, the second input terminal 102 of a (k+1)-th stage may receive the second clock signal CLK2, and the third input terminal 103 thereof may receive the first clock signal CLK1.

The first clock signal CLK1 and the second clock signal CLK2 have the same period and their phases do not overlap each other.

Specifically, the second clock signal CLK2 may be set as a signal shifted by about half a period from the first clock signal CLK1.

Additionally, the stages ST1 to ST4 are supplied with a voltage of a first power source VGL and a voltage of a second power source VGH. In this case, the voltage of the first power source VGL and the voltage of the second power source VGH may have a DC voltage level. In addition, the voltage of the second power source VGH may be set larger than the voltage of the first power source VGL.

Here, the voltage of the first power source VGL may be set to a gate-off level, and the voltage of the second power source VGH may be set to a gate-on level.

Specifically, when the pixel PX is configured of N-channel metal oxide semiconductor (NMOS) transistors, the voltage of the first power source VGL corresponds to a low level, and the voltage of the second power source VGH may correspond to a high level.

However, this is merely an example, and the first power source VGL and the second power source VGH are not limited thereto. For example, the voltage of the first power source VGL and the voltage of the second power source VGH may be set according to the type of transistor, the use environment of the display device, and the like.

Hereinafter, a scan signal output from a scan driver included in the display device according to the embodiment will be described with reference to FIG. 5.

Figure 5:
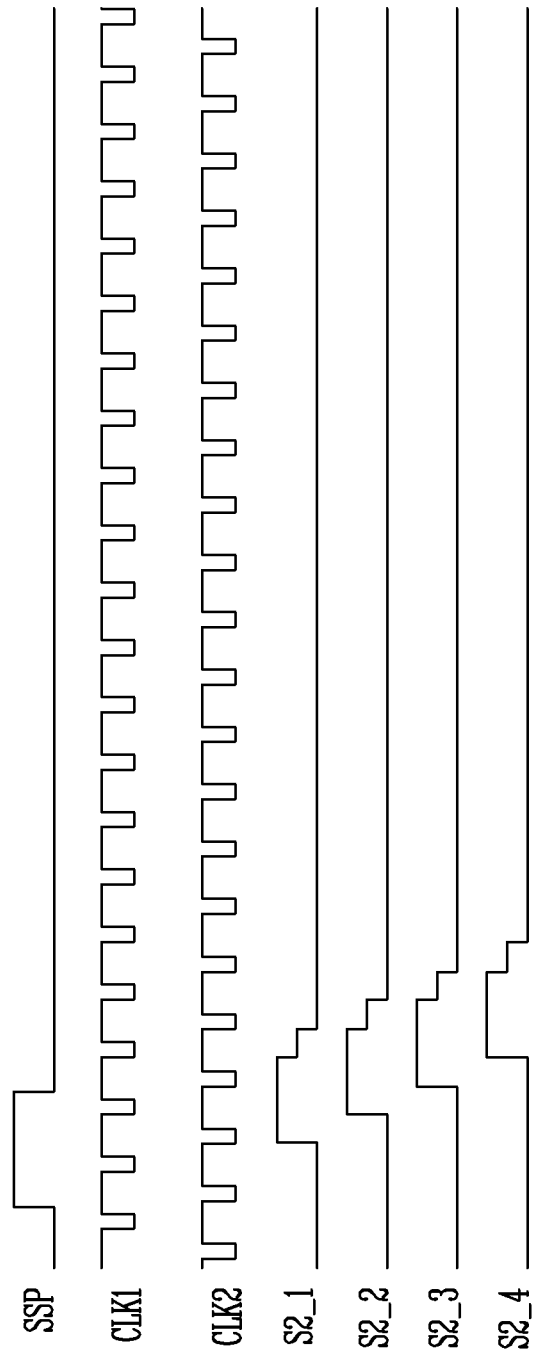
FIG. 5 illustrates a timing diagram of a scan signal output from a scan driver included in a display device according to an embodiment.

FIG. 5 illustrates a timing diagram of a scan signal output from a scan driver included in the display device according to the embodiment.

Referring to FIG. 1, FIG. 3, and FIG. 4, the scan driver 10 may be the second scan driver 300. Each of the first to fourth stages ST1 to ST4 may sequentially output the second scan signal.

Referring to FIG. 5, within one frame (1-Frame) period, the start pulse SSP may overlap a plurality of gate-on periods of and a plurality of gate-off periods of the first and second clock signals CLK1 and CLK2.

In this case, the first stage ST1 may output the second scan signal to a first second scan line S2_1 based on the start pulse SSP and the first and second clock signals CLK1 and CLK2.

In addition, the second stage ST2 may output the second scan signal in which the second scan signal output to the first second scan line S2_1 is shifted by a predetermined horizontal period to a second second scan line S2_2.

Similarly, the third stage ST3 and the fourth stage ST4 may sequentially output the second scan signal at predetermined intervals based on the first clock signal CLK1 and the second clock signal CLK2, respectively.

Hereinafter, a circuit diagram of an example of the stage included in the scan driver of FIG. 4 according to the embodiment will be described with reference to FIG. 6.

Figure 6:
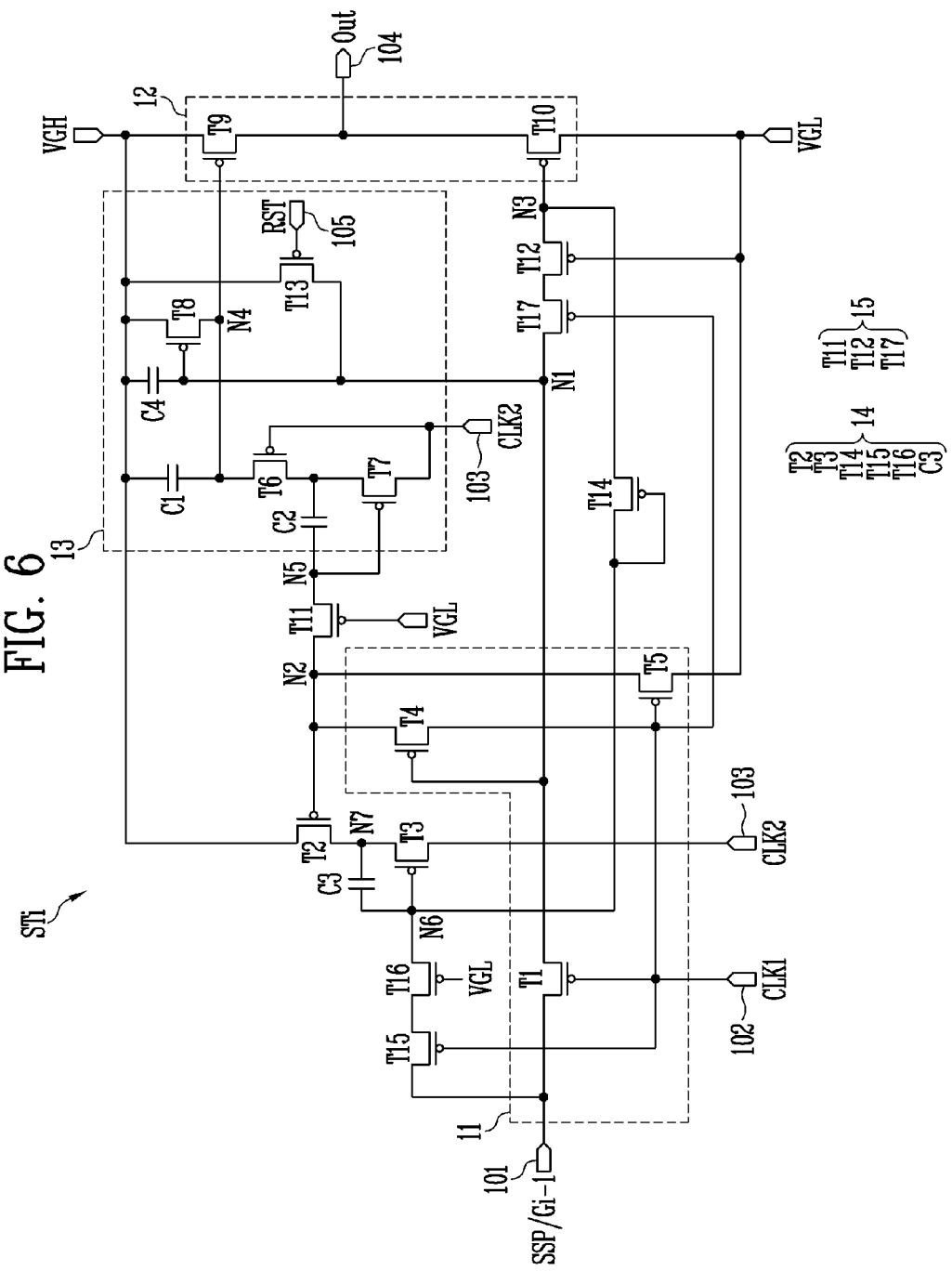
FIG. 6 illustrates a circuit diagram of an example of a stage included in the scan driver of FIG. 4 according to an embodiment.

FIG. 6 illustrates a circuit diagram of an example of a stage ST1 included in the scan driver of FIG. 4 according to an embodiment.

Referring to FIG. 4 and FIG. 6, an i-th stage STi (wherein i is an integer value greater than or equal to 1) may include an input portion 11, an output portion 12, a first signal processing portion 13, a second signal processing portion 14, and a stabilizing portion 15.

As shown in FIG. 6, the i-th stage STi (for example an odd-numbered stage) in which the first clock signal CLK1 is supplied to the second input terminal 102 and the second clock signal CLK2 is supplied to the third input terminal 103 will be mainly described.

However, this is merely an example, and in an (i+1)-th stage (for example, an even-numbered stage), the second clock signal CLK2 may be supplied to the second input terminal 102, and the first clock signal CLK1 may be supplied to the third input terminal 103.

In the embodiment, the start pulse SSP may be supplied to a first input terminal 101 of the i-th stage STi, and an output signal of a previous output line may be supplied to the first input terminal 101 of the remaining stages.

Hereinafter, the i-th stage STi will be referred to as the stage STi and will be described.

The input portion 11 may control a voltage of a first node N1 and a voltage of a second node N2 in response to signals supplied to the first input terminal 101 and the second input terminal 102.

Specifically, the input portion 11 may include a first transistor T1, a fourth transistor T4, and a fifth transistor T5.

The first transistor T1 may be connected between the first input terminal 101 and the first node N1. In addition, a gate electrode of the first transistor T1 may be connected to the second input terminal 102.

Specifically, when the first clock signal CLK1 inputted to the second input terminal 102 has a gate-on level (low level), the first transistor T1 may be in a gate-on state to electrically connect the first input terminal 101 and the first node N1.

The fourth transistor T4 may be connected between the second input terminal 102 and the second node N2. In this case, a gate electrode of the fourth transistor T4 may be electrically connected to the first node N1.

Specifically, the fourth transistor T4 may be turned on or off based on the voltage of the first node N1.

In the embodiment, the fourth transistor T4 may include a plurality of sub-transistors connected in series. Each of the sub-transistors may include a gate electrode that is commonly connected to the first node N1. This is referred to as a dual gate structure.

Accordingly, current leakage due to the fourth transistor T4 may be minimized. However, this is merely an example, and at least one of the remaining transistors as well as the fourth transistor T4 may have a dual gate structure.

The fifth transistor T5 may be connected between the first power source VGL and the second node N2. In addition, a gate electrode of the fifth transistor T5 may be connected to the second input terminal 102.

Specifically, when the first clock signal CLK1 is supplied to the second input terminal 102, the fifth transistor T5 is turned on to supply the voltage of the first power source VGL to the second node N2.

The output portion 12 may supply the voltage of the first power VGL or the voltage of the second power VGH to the output terminal 104 based on the voltage of a third node N3 and the voltage of a fourth node N4.

Specifically, the voltage of the first power source VGL may correspond to the low level of the output signal supplied to the i-th output line Gi, and the voltage of the second power source VGH may correspond to the high level of the output signal supplied to the i-th output line Gi.

In addition, the output portion 12 may include a ninth transistor T9 and a tenth transistor T10.

The tenth transistor T10 may be connected between the first power source VGL and the output terminal 104. In addition, a gate electrode of the tenth transistor T10 may be connected to the third node N3.

Specifically, the tenth transistor T10 may be turned on or off in response to the voltage of the third node N3. In this case, when the tenth transistor T10 is turned on, the output signal supplied to the output terminal 104 may have the first power source VGL, which is a low level.

The ninth transistor T9 may be connected between the second power source VGH and the output terminal 104. In addition, a gate electrode of the ninth transistor T9 may be connected to the fourth node N4.

Specifically, the ninth transistor T9 may be turned on or off in response to the voltage of the fourth node N4. In this case, when the ninth transistor T9 is turned on, the output signal supplied to the output terminal 104 may have the second power source VGH of a high level.

The first signal processing portion 13 may include a sixth transistor T6, a seventh transistor T7, an eighth transistor T8, a thirteenth transistor T13, a first capacitor C1, a second capacitor C2, and a fourth capacitor C4.

The first signal processing portion 13 may control the voltage of the fourth node N4. Specifically, the first signal processing portion 13 may supply the voltage of the second power source VGH to the fourth node N4 based on the voltage of the first node N1, or may control the voltage of the fourth node N4 in response to the voltage of the second node N2 based on the second clock signal CLK2 supplied to the third input terminal 103.

For example, when the voltage of the second node N2 has a low level, the first signal processing portion 13 allows the voltage of the fourth node N4 to have a gate-on level (low level) such that the eighth transistor T8 may be turned on.

One end of the second capacitor C2 may be connected to a fifth node N5, and the other end thereof may be connected between the sixth transistor T6 and the seventh transistor T7.

The sixth transistor T6 may be connected between the other end of the second capacitor C2 and the fourth node N4. In addition, a gate electrode of the sixth transistor T6 may be connected to the third input terminal 103.

Specifically, the sixth transistor T6 may be turned on in response to a gate-on level (low level) of the second clock signal CLK2 supplied to the third input terminal 103.

The seventh transistor T7 may be connected between the other end of the second capacitor C2 and the third input terminal 103. In addition, a gate electrode of the seventh transistor T7 may be connected to the fifth node N5.

Specifically, the seventh transistor T7 may be turned on or off in response to the voltage of the fifth node N5.

The eighth transistor T8 may be connected between the second power source VGH and the fourth node N4. In addition, a gate electrode of the eighth transistor T8 may be connected to the first node N1.

Specifically, the eighth transistor T8 may be turned on or off in response to the voltage of the first node N1.

The thirteenth transistor T13 may be connected between the second power source VGH and the first node N1. In addition, a gate electrode of the thirteenth transistor T13 may be connected to a reset input terminal 105. The thirteenth transistor T13 is turned on when a reset signal RST is inputted to the reset input terminal 105 to supply the voltage of the second power source VGH to the first node N1.

In the embodiment, the reset signal RST is a global signal, and the reset signal RST may be commonly applied to the stages ST1 to ST4.

During an initializing period when the reset signal RST is supplied to the scan driver 10, the high level output signals may be simultaneously output to output lines G1 to G4. In addition, the low level first and second clock signals CLK1 and CLK2 may be supplied.

The first capacitor C1 may be connected between the second power source VGH and the fourth node N4. In this case, the first capacitor C1 may charge a voltage applied to the fourth node N4, and stably maintain the voltage of the fourth node N4.

The fourth capacitor C4 may be connected between the second power source VGH and the first node N1. In this case, the fourth capacitor C4 may charge a voltage applied to the first node N1, and stably maintain the voltage of the first node N1.

The second signal processing portion 14 may include a second transistor T2, a third transistor T3, a fourteenth transistor T14, a fifteenth transistor T15, a sixteenth transistor T16, and a third capacitor C3.

The fourteenth transistor T14 may be connected between a sixth node N6 and the third node N3. In addition, a gate electrode of the fourteenth transistor T14 may be connected to the sixth node N6.

Specifically, the fourteenth transistor T14 may have a diode structure connected in a direction to the sixth node N6 from the third node N3. Therefore, no current flows from the sixth node N6 to the third node N3.

In this case, the fourteenth transistor T14 may be turned on or turned off in response to the voltage of the sixth node N6.

The fifteenth transistor T15 may be connected between the first input terminal 101 and the sixteenth transistor T16. In addition, a gate electrode of the fifteenth transistor T15 may be connected to the second input terminal 102.

In this case, when the first clock signal CLK1 is supplied to the second input terminal 102, the fifteenth transistor T15 may be turned on to provide a signal supplied from the first input terminal 101 to the sixteenth transistor T16.

The sixteenth transistor T16 is connected between the fifteenth transistor T15 and the sixth node N6. In addition, a gate electrode of the sixteenth transistor T16 may be connected to the first power source VGL. In this case, since the first power source VGL is at a low level (L), the sixteenth transistor T16 is always in a gate-on state.

Accordingly, when the first clock signal CLK1 of the low level (L) is supplied from the second input terminal 102, the fifteenth transistor T15 may be turned on to provide a signal supplied from the first input terminal 101 to the sixth node N6.

The third transistor T3 may be connected between the third input terminal 103 and the seventh node N7. In addition, a gate electrode of the third transistor T3 may be connected to the sixth node N6.

Accordingly, the third transistor T3 may be turned on or turned off in response to the voltage of the sixth node N6.

The third capacitor C3 may be connected between the sixth node N6 and the seventh node N7. In this case, the voltage level of the sixth node N6 may be swung in a predetermined range by coupling of the third capacitor C3 according to the voltage change of the seventh node N7. That is, the voltage of the sixth node N6 may depend on the change in the voltage level of the second clock signal CLK2.

The second transistor T2 may be connected between the seventh node N7 and the second power source VGH. In addition, a gate electrode of the second transistor T2 may be connected to the second node N2.

Accordingly, the second transistor T2 may be turned on or turned off in response to the voltage of the second node N2.

The stabilizing portion 15 may electrically connect the input portion 11 and the output portion 12. In addition, the stabilizing portion 15 may limit an amount of voltage drop of the first node N1 and an amount of voltage drop of the second node N2.

Specifically, when the amount of voltage drop of the third node N3 is large, the stabilizing portion 15 serves as a resistor, so that a voltage may be divided between the first node N1 and the third node N3.

Accordingly, even if the voltage change of the third node N3 is large, a drain-source voltage of the first transistor T1 is prevented from suddenly increasing, and the first transistor T1 connected to the first node N1 may be protected.

In addition, the stabilizing portion 15 may serve as a resistor when the voltage of the fifth node N5 significantly drops due to coupling of the second capacitor C2. Accordingly, it is possible to protect the second transistor T2, fourth transistor T4 and fifth transistor T5 that are connected to the second node N2.

Specifically, the stabilizing portion 15 may include an eleventh transistor T11, a twelfth transistor T12 and a seventeenth transistor T17.

The twelfth transistor T12 may be connected between the third node N3 and the seventeenth transistor T17. In addition, a gate electrode of the twelfth transistor T12 may be connected to the first power source VGL. Accordingly, the twelfth transistor T12 may maintain a turn-on state by the first power source VGL.

Specifically, when the voltage of the third node N3 decreases to a value lower than the voltage of the first power source VGL, a voltage may be divided by the twelfth transistor T12, and the voltage of the first node N1 may be stably maintained.

For example, the voltage of the first node N1 does not decrease than the voltage of the first power source VGL. Therefore, bias stress that may be applied to the first transistor T1 may be alleviated.

The seventeenth transistor T17 may be connected between the first node N1 and the twelfth transistor T12. In addition, a gate electrode of the seventeenth transistor T17 may be connected to the second input terminal 102. Accordingly, the seventeenth transistor T17 may have a gate turn-on state by the first clock signal CLK1 of the low level (L) state inputted to the second input terminal 102.

The eleventh transistor T11 may be connected between the second node N2 and the fifth node N5. In addition, a gate electrode of the eleventh transistor T11 may be connected to the first power source VGL. Accordingly, the eleventh transistor T11 may always maintain a gate turn-on state.

Specifically, when the voltage of the fifth node N5 decreases to a value lower than the voltage of the first power source VGL by coupling of the second capacitor C2, the eleventh transistor T11 serves as a resistor, so that the voltage of the second node N2 may be stably maintained.

For example, the voltage of the second node N2 does not decrease than the voltage of the first power source VGL. Accordingly, bias stress that may be applied to the fourth transistor T4 and fifth transistor T5 may be reduced.

Hereinafter, an operation of the stage of FIG. 6 according to the embodiment will be described with reference to FIG. 7.

Figure 7:
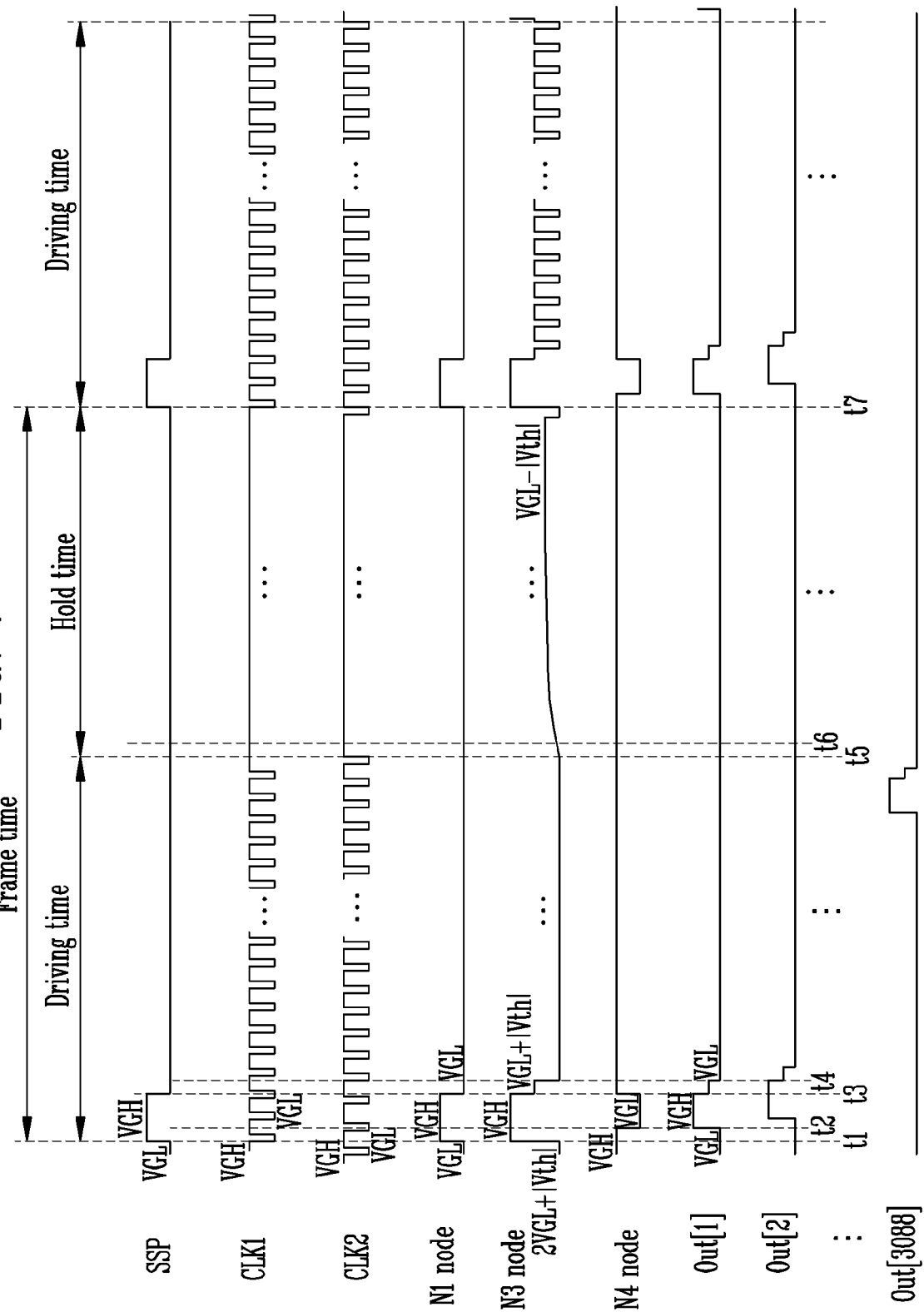
FIG. 7 illustrates a timing diagram of an operation of the stage of FIG. 6.

FIG. 7 illustrates a timing diagram of an operation of the stage of FIG. 6.

Referring to FIG. 1, FIG. 6, and FIG. 7, the first clock signal CLK1 and the second clock signal CLK2 are supplied at different timings.

Specifically, the second clock signal CLK2 is set as a signal shifted by half a period (for example, 1 horizontal period) from the first clock signal CLK1.

A high level (H) of the start pulse SSP may correspond to the voltage of the second power source VGH, and a low level (L) of the start pulse SSP may correspond to the voltage of the first power source VGL.

Specifically, the voltage of the first power source VGL may be about −8 V, and the voltage of the second power source VGH may be about 10 V. However, this is illustrative, and the start pulse SSP of this and other embodiments is not limited thereto.

In addition, FIG. 7 assumes a case of driving the second scan driver 300 of FIG. 1 by reducing the frequency thereof. In this case, one frame period (1 frame) is divided into a driving time and a hold time.

The scan driver 10 supplies the output signal by using the stages ST1 to ST4 during the driving time of one frame period, and does not supply the output signal by using the stages ST1 to ST4 during the hold time thereof.

For this purpose, in the embodiment described with reference to FIG. 7, the clock signals CLK1 and CLK2 may be supplied at a first frequency so that the output signal may be stably output during the driving time, and the clock signals CLK1 and CLK2 may be supplied at a second frequency lower than the first frequency so that power consumption may be reduced during the hold time.

For example, during the driving time, the first clock signal CKL1 and the second clock signal CLK2 may be repeatedly changed to a voltage of a high level (H) (VGH) or low level (L) (VGL), and during the hold time, the first clock signal CKL1 and the second clock signal CLK2 may be maintained at the high level (H) (VGH).

The low level (L) (VGL+|Vth|) of the third node N3 may be similar to a value obtained by adding an absolute value of a threshold voltage of the twelfth transistor T12 to the voltage of the first power source VGL. However, since the threshold voltage (|Vth|) of the twelfth transistor T12 is very small compared with the voltage of the first power source VGL, it will be assumed and described that the low level (L) (VGL+|Vth|) of the third node N3, the low level VGL of the fourth node N4, the voltage of the first power source VGL, the low level (L) VGL of the start pulse SSP, and the low level (L) VGL of the output voltage, which is the output signal, are substantially the same or similar.

In addition, a 2-low level (2L) (2VGL+|Vth|) of the third node N3 may be a voltage level similar to a value obtained by adding an absolute value of the threshold voltage of the twelfth transistor T12 to 2*VGL. In this case, since the threshold voltage (|Vth|) of the twelfth transistor T12 is very small compared with the voltage of the 2-low level (2L), it will be assumed and described that the 2-low level (2L) is 2*VGL.

At a first time point t1, the start pulse SSP may be changed from the low level (L) to the high level (H), and may be supplied to the first input terminal 101.

In addition, the first clock signal CLK1 may be changed from the high level (H) to the low level (L), and may be supplied to the second input terminal 102 at the low level (L).

In addition, the second clock signal CLK2 may be changed from the low level (L) to the high level (H), and may be supplied to the third input terminal 103 at the high level (H).

In this case, due to the first clock signal CLK1 of the low level (L) supplied to the second input terminal 102, the first transistor T1 is in a gate-on state. Therefore, since the start pulse SSP of the high level (H) is applied to the first node N1 through the first transistor T1, the voltage VGH, which is the start pulse SSP of the high level (H), is applied to the first node N1.

In addition, due to the first clock signal CLK1 at the low level (L) supplied to the second input terminal 102, the fifteenth transistor T15 is in a gate-on state. Therefore, the start pulse SSP of the high level (H) is applied to the sixth node N6 through the fifteenth transistor T15 and the sixteenth transistor T16. In this case, the third transistor T3 is turned off by the voltage of the sixth node N6.

In addition, the fifth transistor T5 and the seventeenth transistor T17 are turned on by the first clock signal CLK1 of the low level (L) supplied to the second input terminal 102.

When the fifth transistor T5 is turned on, the voltage VGL is supplied to the second node N2. In this case, since the eleventh transistor T11 is set to a turn-on state, the fifth node N5 is set to the voltage VGL. When the fifth node N5 is set to the voltage VGL, the seventh transistor T7 is turned on. In this case, the sixth transistor T6 is turned off by the high level second clock signal CLK2 supplied to the third input terminal 103, and the voltage of the fourth node N4 is not changed by the voltage of the second node N2 (that is, fifth node N5).

When the seventeenth transistor T17 is turned on, the voltage of the first node N1, that is, the voltage of the start pulse (SSP) of the high level (H), is supplied to the third node N3 via the seventeenth transistor T17 and the twelfth transistor T12.

As a result, the third node N3 is applied with the voltage VGH due to the start pulse SSP having the high level (H).

In addition, since the voltage VGH is applied to the third node N3 due to the start pulse SSP having the high level (H), the tenth transistor T10 is turned off.

At a second time point t2, the start pulse SSP may be supplied to the first input terminal 101 at the high level (H).

In addition, the first clock signal CLK1 may be supplied to the second input terminal 102 at the high level (H). In addition, the second clock signal CLK2 may be supplied to the third input terminal 103 at the low level (L).

In this case, due to the second clock signal CLK2 of the low level (L) supplied to the third input terminal 103, the sixth transistor T6 is in a gate turn-on state.

In this case, the second capacitor C2 stores a voltage corresponding to the turn-on according to the voltage at the time point t1, and accordingly, the seventh transistor T7 maintains the turn-on state. Accordingly, when the sixth transistor T6 is turned on, the low voltage of the second clock signal CLK2 is supplied to the fourth node N4.

Accordingly, since the voltage VGL of the low level (L) is applied to the fourth node N4, the ninth transistor T9 is changed to a turn-on state.

Thus, the voltage of the second power source VGH is output to the output terminal 104. That is, at the second time point t2, the gate voltage of the high level (H) is output to the output terminal 104.

At a third time point t3, the start pulse SSP may be changed from the high level (H) to the low level (L), and may be supplied to the first input terminal 101 at the low level (L).

In addition, the first clock signal CLK1 may be supplied to the second input terminal 102 at the low level (L). In addition, the second clock signal CLK2 may be changed from the low level (L) to the high level (H), and may be supplied to the third input terminal 103 at the high level (H).

In this case, the first clock signal CLK1 applied to the second input terminal 102 is the voltage VGL of the low level (L), so the first transistor T1 is turned on. Accordingly, since the start pulse SSP of the low level (L) is applied to the first node N1 through the first transistor T1, the voltage VGL of the low level (L) is applied to the first node N1.

In addition, the fifteenth transistor T15, the fifth transistor T5, and the seventeenth transistor T17 are turned on by the first clock signal CLK1 of the low level (L).

In addition, when the seventeenth transistor T17 is turned on, the voltage VGL applied to the first node N1 is supplied to the third node N3 via the twelfth transistor T12. When the voltage VGL is supplied to the third node N3, the tenth transistor T10 is turned on, so that the voltage VGL is supplied to the output terminal 104.

In addition, when the voltage VGL is applied to the first node N1, the eighth transistor T8 is turned on. When the eighth transistor T8 is turned on, the voltage VGH is supplied to the fourth node N4, and thus the ninth transistor T9 is turned off.

When the fifteenth transistor T15 is turned on, the voltage VGL is supplied to the sixth node N6 via the fifteenth transistor T15 and the sixteenth transistor T16. When the voltage VGL is supplied to the sixth node N6, the fourteenth transistor T14 is set to the turn-on state, and accordingly, the voltage VGL, which is the start pulse SSP of the low level (L), is applied to the third node N3.

Accordingly, the tenth transistor T10 is turned on, and the gate voltage VGL is output to the output terminal 104.

In the embodiment described herein, since the voltage of the third node N3 is lowered to the voltage VGL by using the fourteenth transistor T14 as well as the seventeenth transistor T17, the voltage VGL may be applied to the third node N3 in a short time.

At a fourth time point t2, the start pulse SSP may be supplied to the first input terminal 101 at the low level (L).

In addition, the first clock signal CLK1 may be supplied to the second input terminal 102 at the high level (H). In addition, the second clock signal CLK2 may be changed from the high level H to the low level L, and may be supplied to the third input terminal 103 at the low level (L).

When the clock CLK1 of the high level (H) is inputted to second input terminal 102, the transistors T15, T1, T5, and T17 are set to a turn-off state.

When the second clock signal CLK2 of the low level (L) is supplied to the third input terminal 103, the third transistor T3 maintains the turn-on state by the low voltage applied to the sixth node N6 in the previous period. That is, the third transistor T3 maintains the turn-on state by the voltage charged in the third capacitor C3. Accordingly, the second clock signal CLK2 inputted to the third input terminal 103 is applied to the seventh node N7 through the third transistor T3.

In this case, by coupling of the third capacitor C3, the voltage of the sixth node N6 may drop to the 2-low level (2L).

In addition, since the fourteenth transistor T14 is connected in a forward direction, the voltage of the third node N3 may drop to the 2-low level 2L similar to the voltage of the sixth node N6.

In this case, by the fourteenth transistor T14, the voltage of the third node N3 and the voltage of the sixth node N6 may have a voltage difference as much as the threshold voltage of the fourteenth transistor T14, but this may be ignored.

As a result, the third node N3 is in a state of the 2-low level (2L), so that the tenth transistor T10 is completely turned on.

Accordingly, the voltage of the first power source VGL is output to the output terminal 104 through the tenth transistor T10.

Actually, the stages ST output the output signal to the output terminal 104 while repeating the above-described processes during the driving time.

Hereinafter, a period from a fifth time point t5 to a seventh time point T7 is referred to as the hold time. In addition, a period from the fifth time point t5 to a sixth time point t6 is referred to as a first hold time, and a period from the sixth time point t6 to the seventh time point t7 is referred to as a second hold time.

In this case, the hold time is a period in which the output signal is not output, and in which the first clock signal CKL1 and the second clock signal CLK2 may not be repeatedly changed to the voltage of the high level (H) (VGH) or the voltage of the low level (L) (VGL), and may be maintained at the voltage of the high level (H) (VGH).

In the hold time, the start pulse SSP may be supplied to the first input terminal 101 at the low level (L) (VGL), and the first clock signal CLK1 may be supplied to the second input terminal 102 at the high level (H). In addition, the second clock signal CLK2 may be supplied to the third input terminal 103 at the high level (H).

In the first hold time (t5-t6), the sixth node N6 maintains the voltage VGL corresponding to the driving time. (For example, VGL+Vth)

In this case, since the fourteenth transistor T14 is diode-connected in a direction to the sixth node N6 from the third node N3, a current does not flow from the sixth node N6 to the third node N3. Accordingly, the voltage of the third node N3 is maintained at the voltage 2VGL, which has the 2-low level (2L).

In addition, since the seventeenth transistor T17 is turned off during the first hold time t5 to t6, it is possible to prevent the voltage of the third node N3 from rising due to the voltage of the first node N1. That is, the voltage of the third node N3 is maintained at the voltage 2VGL, which has the 2-low level (2L), and accordingly, the tenth transistor T10 stably maintains a turn-on state.

In the second hold time t6 to t7, as the hold time continues, the voltage of the third node N3 gradually increases due to the leakage current of the twelfth transistor T12 and the fourteenth transistor T14.

In this case, the voltage of the third node N3 increases to a maximum voltage (VGL−|Vth|), and accordingly, the tenth transistor T10 may maintain a turn-on state during the holding time.

More specifically, the tenth transistor T10 functions as a pull-down buffer, so that it has a larger size than other transistors. Therefore, a relatively large parasitic capacitance may be formed between the gate electrode and the source electrode of the tenth transistor T10. Due to this parasitic capacitance, the voltage of the third node N3 at the seventh time point t7 may be converged to the voltage level of VGL−|Vth|.

As described above, in the second hold time t6 to t7, the voltage of the third node N3 is converged to VGL−|Vth|. Accordingly, the tenth transistor T10 maintains the gate turn-on state, and the first power source VGL may be output to the output terminal 104.

Accordingly, in the second hold time t6 to t7, as the hold time continues, a voltage rising width of the third node N3 may be reduced due to the leakage current of the twelfth transistor T12 and the fourteenth transistor T14, and since the tenth transistor T10 is maintained in the gate turn-on state, the output voltage output to the output terminal 104 may be constantly maintained at the voltage VGL of the low level (L).

Therefore, in the embodiment described herein, even if the first clock signal CLK1 and the second clock signal CLK2 is supplied at the high level voltage during the hold time, the output voltage inputted to the display part 100 may be constantly maintained at the low level (L). In addition, since the clocks CLK1 and CLK2 are supplied at the high voltage during the holding time, it is possible to reduce the power consumption consumed by the display device 1000.

Figure 8:
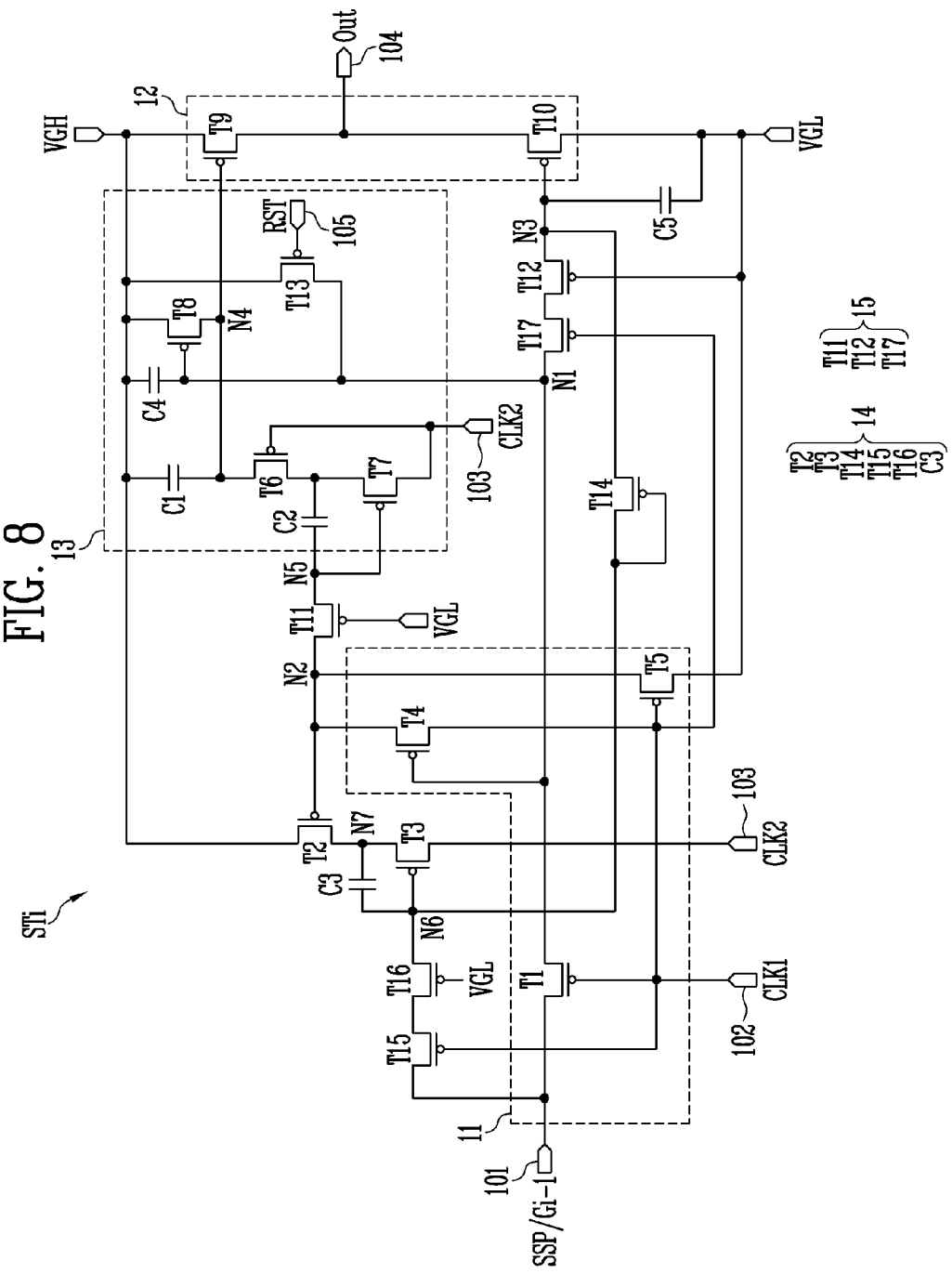
FIG. 8 illustrates a circuit diagram of another example of the stage according to the embodiment of FIG. 6.

FIG. 8 illustrates a circuit diagram of another example of the stage according to the embodiment of FIG. 6.

According to the embodiment, in order to reduce the voltage rising width of the third node N3 due to the leakage current of the twelfth transistor T12 and the fourteenth transistor T14 in the second hold time t6 to t7, as shown in FIG. 8, a fifth capacitor C5 connected between the third node N3 and the first power source VGL may be further included.

In this case, the fifth capacitor C5 may be charged with the voltage applied to the third node N3. Therefore, the voltage rising width of the third node N3 decreases, so that the tenth transistor T10 may stably maintain the turn-on state during the hold time.

In addition, according to another embodiment, the voltage of the third node N3 may be periodically initialized to 2VGL+|Vth| by applying CLK1 and CLK2 that repeat the high level (H) and the low level (L) at least once during the holding time.

Hereinafter, a circuit diagram and timing diagram of another example of a stage included in the scan driver of FIG. 4 according to the embodiment will be described with reference to FIG. 9A and FIG. 9B.

Figure 9A:
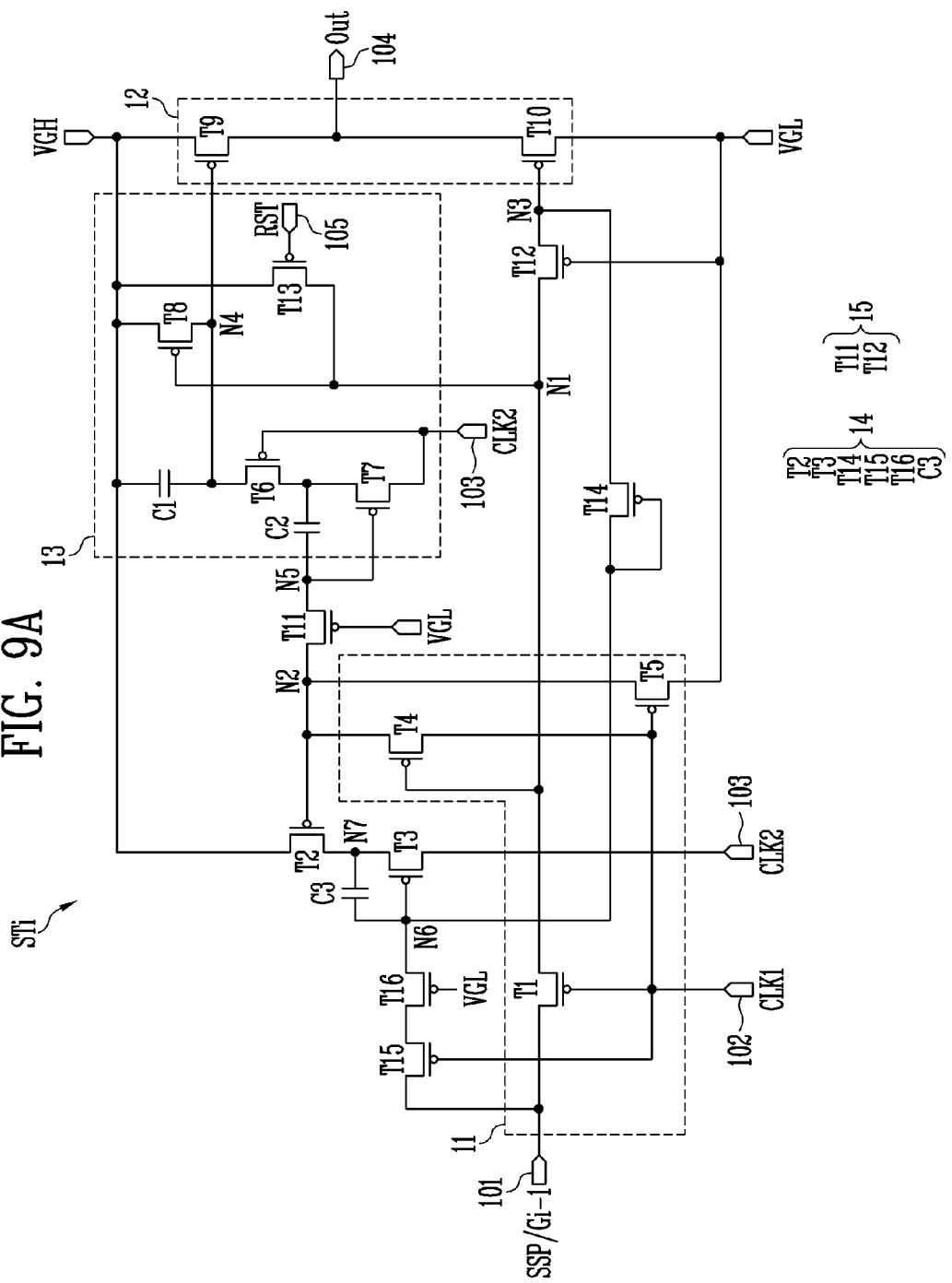
FIG. 9A illustrates a circuit diagram of an example of a stage included in the scan driver of FIG. 4 according to another embodiment.

FIG. 9A illustrates a circuit diagram of an example of a stage included in the scan driver of FIG. 4 according to another embodiment. FIG. 9B illustrates a timing diagram of an operation of the stage of FIG. 9A.

The circuit diagram of FIG. 9A is a circuit diagram in which the seventeenth transistor T17 and the fourth capacitor C4 are removed from the circuit diagram of the example of the stage included in the scan driver of FIG. 6. In the embodiment, a driving method of FIG. 9B may be performed in the state in which the seventeenth transistor T17 and the fourth capacitor C4 are included. However, it will be assumed and described that the seventeenth transistor T17 and the fourth capacitor C4 are removed from FIG. 9A in consideration of a layout and the like.

Referring to FIG. 9A and FIG. 9B, the first clock signal CLK1 and the second clock signal CLK2 are supplied at a first frequency during the driving time, and the first clock signal CLK1 and the second clock signal CLK2 are supplied at a second frequency lower than the first frequency during the hold time. For example, the second frequency may be set so that the first clock signal CLK1 and the second clock signal CLK2 repeat the low level and the high level at least once during the hold time.

In FIG. 9A and FIG. 9B, descriptions from the first time point t1 to the sixth time point t6 are the same as those of FIG. 6 and FIG. 7, so redundant descriptions thereof are omitted for ease in explanation of these figures.

The hold time may include the fifth time point t5 to an nth time point tn.

As described above, since the seventeenth transistor T17 and the fourth capacitor C4 have been removed, the leakage current due to the twelfth transistor T12 increases.

In an additional embodiment, the first clock signal CLK1 and the second clock signal CLK2 repeat the low level and high level at the second frequency. In this case, as described above, the voltage of the sixth node N6 is periodically (that is, when the second clock signal CLK2 of the low level is supplied to the third input terminal 103) decreased to the voltage of 2VGL.

When the voltage of the sixth node N6 decreases, the voltage of the third node N3 also periodically decreases to 2VGL+|Vth|, and accordingly, the tenth transistor T10 may be stably turned on during the holding time.

In the third hold time t5 to t6, the start pulse SSP may be supplied through the first input terminal 101 with the voltage VGL of the low level (L).

In addition, the first clock signal CLK1 may be supplied to the second input terminal 102 at the low level (L). In addition, the second clock signal CLK2 may be supplied to the third input terminal 103 at the high level (H).

Accordingly, since the output voltage output from the second scan driver 300 to be inputted to the display part 100 is maintained at the first power source VGL of the low level (L), an increase in power consumption consumed by the display device 1000 may be prevented.

In the fourth hold time t6 to t7, the start pulse SSP is in the low level (L) state, and the first clock signal CLK1 may be supplied to the second input terminal 102 at the high level (H), then changed to the low level (L), and inputted to the second input terminal 102 at the low level (L).

In addition, the second clock signal CLK2 may be supplied to the third input terminal 103 at the low level (L), then changed to the high level (H), and supplied to the third input terminal 103 at the high level (H).

In this case, as described in FIG. 6 and FIG. 7, since the fourteenth transistor T14 is diode-connected in a direction to the sixth node N6 from the third node N3, a current does not flow from the sixth node N6 to the third node N3.

Accordingly, the voltage of the third node N3 at the sixth time point t6, at which the fourth hold time t6 to t7 starts, may be decreased to 2VGL+|Vth|.

In this case, as in FIG. 6 and FIG. 7, as the hold time continues, a leakage current occurs between the twelfth transistor T12 and the fourteenth transistor T14, so that the voltage of the third node N3 increases.

Specifically, the voltage of the third node N3 may rise from the voltage of 2VGL, which has the 2-low level (2L), to the voltage VGH, which has the high level (H).

In this case, the tenth transistor T10 functions as a pull-down buffer, so that it has a larger size than other transistors. Therefore, a relatively large parasitic capacitance may be formed between the gate electrode and the source electrode of the tenth transistor T10. Due to this parasitic capacitance, the voltage of the third node N3 at the seventh time point t7 may be converged to VGL−|Vth|.

Accordingly, in the fourth hold time t6 to t7, the voltage of the third node N3 may be converged to VGL−|Vth|. Accordingly, the tenth transistor T10 maintains the gate turn-on state, and the first power source VGL may be output to the output terminal 104.

Accordingly, in the fourth hold time t6 to t7, as the hold time continues, a voltage rising width of the third node N3 may be reduced due to the leakage current occurring between the twelfth transistor T12 and the fourteenth transistor T14, and since the tenth transistor T10 is maintained in the gate turn-on state, the output voltage output to the output terminal 104 may be constantly maintained at the voltage VGL of the low level (L).

According to the above-described method, even if the frequency of the hold time in which the first clock signal CLK1 and the second clock signal CLK2 are repeatedly changed to the voltage VGH of the high level (H) or the voltage VGL of the low level (L) is set as a frequency that is lower than 120 Hz and higher than 60 Hz, the voltage of the third node N3 may not rise to the voltage VGH of the high level (H) but may rise to VGL−|Vth| of the low level (L), so that the tenth transistor T10 may maintain the gate turn-on state, and the first power source VGL may be stably output to the output terminal 104.

Figure 9C:
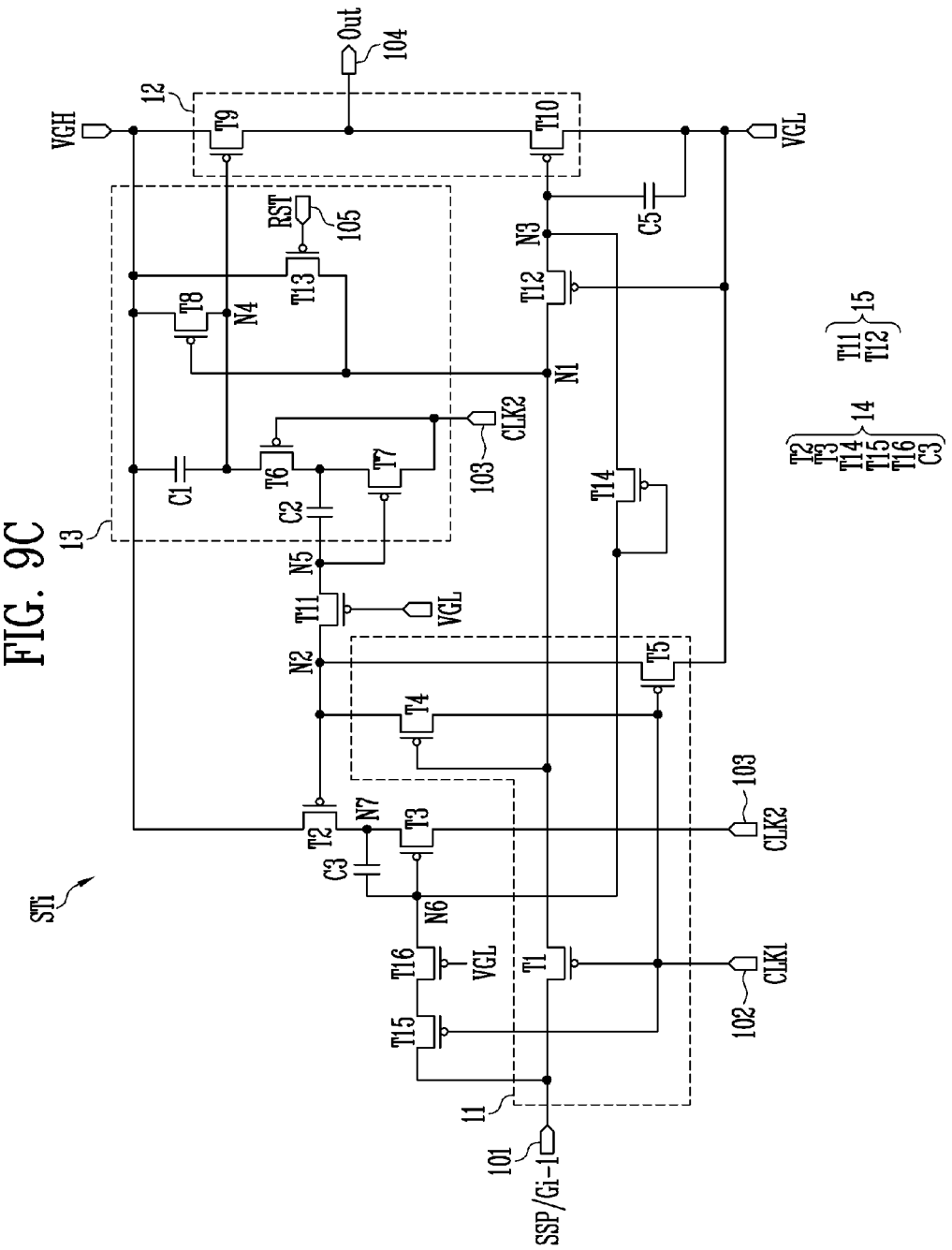
FIG. 9C illustrates a circuit diagram of another example of the stage according to the embodiment of FIG. 9A.

FIG. 9C illustrates a circuit diagram of another example of the stage according to the embodiment of FIG. 9A.

Referring to FIG. 9C, in each hold time, in order to reduce the voltage rising width of the third node N3 due to the leakage current between the twelfth transistor T12 and the fourteenth transistor T14, the fifth capacitor C5 connected between the third node N3 and the first power source VGL may further be included.

In this case, the fifth capacitor C5 may be charged with the voltage applied to the third node N3. Therefore, the voltage rising width of the third node N3 decreases, so that the tenth transistor T10 may stably maintain the turn-on state during the hold time.

Accordingly, an increase in power consumption consumed by the display device 1000 may be prevented by constantly maintaining the output voltage output from the second scan driver 300 and inputted to the display part 100.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A scan driver comprising:
a plurality of stages configured to output an output signal in response to clock signals supplied at a first frequency during a driving time of one frame,
wherein the plurality of stages are supplied with the clock signals at a second frequency lower than the first frequency during a hold time of the one frame that is separate from the driving time of the one frame; and
the clock signals include a first clock signal and a second clock signal,
wherein each of the plurality of stages includes:
an input portion controlling a voltage of a first node and a voltage of a second node based on signals supplied to a first input terminal and a second input terminal;
a first signal processing portion that supplies a voltage of a second power source to a fourth node based on the voltage of the first node, or electrically connects the second node and the fourth node through a fifth node based on a voltage of a first power source;
a second signal processing portion that includes a first transistor connected between a third node and a sixth node, and is connected to the first input terminal, the second input terminal, and the first power source to control a voltage of the third node based on an operation of the first transistor; and
an output portion that controls a voltage applied to the third node to be less than or equal to the voltage of the first power source, and supplies the voltage of the first power source or the voltage of the second power source to an output terminal as a scan signal based on the voltage of the third node and a voltage of the fourth node.

2. The scan driver of claim 1, wherein
the plurality of stages do not output the output signal during the hold time of the one frame, and
the clock signals maintain a constant voltage level during the hold time of the one frame.

3. The scan driver of claim 1, wherein
the clock signals repeat a low voltage level and a high voltage level more than once during the hold time of the one frame.

4. The scan driver of claim 1, wherein the output portion includes:
a second transistor that is connected between the second power source and the output terminal, and of which a gate electrode receives the voltage of the fourth node; and
a third transistor that is connected between the output terminal and the first power source, and of which a gate electrode receives the voltage of the third node.

5. The scan driver of claim 4, wherein
the input portion includes:
a fourth transistor that is connected between the first input terminal and the first node, and of which a gate electrode is connected to the second input terminal to receive the first clock signal;
a fifth transistor that is connected between the second input terminal and the second node, and of which a gate electrode receives the voltage of the first node; and
a sixth transistor that is connected between the second node and the first power source, and of which a gate electrode is connected to the second input terminal to receive the first clock signal.

6. The scan driver of claim 5, wherein
the first signal processing portion includes:
a second capacitor having a first end connected to the fifth node and a second end connected to a first electrode of an eighth transistor;
a seventh transistor that is connected between the first electrode of the eighth transistor and a third input terminal, and of which a gate electrode receives a voltage of the fifth node;
the eighth transistor that is connected between a first electrode of the seventh transistor and the fourth node, and of which a gate electrode receives the second clock signal supplied from the third input terminal;
a first capacitor having a first end connected to the fourth node and a second end connected to the second power source;
a fourth capacitor having a first end connected to the first node and a second end connected to the second power source;
a ninth transistor that is connected between the fourth node and the second power source, and of which a gate electrode receives the voltage of the first node; and
a tenth transistor that is connected between the first node and the second power source, and of which a gate electrode is connected to a reset input terminal.

7. The scan driver of claim 6, wherein
the second signal processing portion further includes:
an eleventh transistor that is connected between the first input terminal and a thirteenth transistor, and of which a gate electrode receives the first clock signal supplied from the second input terminal;
the thirteenth transistor that is connected between the eleventh transistor and the sixth node, and of which a gate electrode receives the voltage of the first power source;
a fourteenth transistor that is connected between the third input terminal and a seventh node, and of which a gate electrode receives a voltage of the sixth node;
a third capacitor having a first end connected to the sixth node and a second end connected to the seventh node; and
a fifteenth transistor that is connected between the seventh node and the second power source, and of which a gate electrode receives the voltage of the second node.

8. The scan driver of claim 7, wherein each of the plurality of stages further includes:
a stabilizing portion that is electrically connected between the input portion and the output portion, and limits a voltage drop amount of the first node and a voltage drop amount of the second node, and
the stabilizing portion includes:
a sixteenth transistor that is connected between the second node and the fifth node, and of which a gate electrode receives the voltage of the first power source;
a seventeenth transistor that is connected between the first node and an eighteenth transistor, and of which a gate electrode receives the first clock signal; and
the eighteenth transistor that is connected between the seventeenth transistor and the third node, and of which a gate electrode receives the voltage of the first power source.

9. The scan driver of claim 1, wherein each of the plurality of stages further includes:
a fifth capacitor having a first end connected to the third node and a second end connected to the first power source, and
the fifth capacitor stores the voltage of the third node.

10. The scan driver of claim 5, wherein
the first signal processing portion includes:
a second capacitor having a first end connected to the fifth node and a second end connected to a first electrode of a ninth transistor;
an eighth transistor that is connected between the first electrode of the ninth transistor and a third input terminal, and of which a gate electrode receives a voltage of the fifth node;
the ninth transistor that is connected between a first electrode of the eighth transistor and the fourth node, and of which a gate electrode receives the second clock signal supplied from the third input terminal;
a first capacitor having a first end connected to the fourth node and a second end connected to the second power source;
a tenth transistor that is connected between the fourth node and the second power source, and of which a gate electrode receives the voltage of the first node; and
an eleventh transistor that is connected between the first node and the second power source, and of which a gate electrode is connected to a input terminal.

11. The scan driver of claim 10, wherein
the second signal processing portion further includes:
a twelfth transistor that is connected between the first input terminal and a fourteenth transistor, and of which a gate electrode receives a first clock signal supplied from the second input terminal;

the fourteenth transistor that is connected between the twelfth transistor and the sixth node, and of which a gate electrode receives the voltage of the first power source;

a fifteenth transistor that is connected between the third input terminal and a seventh node, and of which a gate electrode receives a voltage of the sixth node;

a third capacitor having a first end connected to the sixth node and a second end connected to the seventh node; and a sixteenth transistor that is connected between the seventh node and the second power source, and of which a gate electrode receives the voltage of the second node.

12. The scan driver of claim 11, wherein each of the plurality of stages further includes:

a stabilizing portion that is electrically connected between the input portion and the output portion, and limits a voltage drop amount of the first node and a voltage drop amount of the second node.

13. The scan driver of claim 12, wherein the stabilizing portion includes:

a seventeenth transistor that is connected between the second node and the fifth node, and of which a gate electrode receives the voltage of the first power source; and an eighteenth transistor that is connected between the first node and the third node, and of which a gate electrode receive the voltage of the first power source.

14. The scan driver of claim 10, each of the plurality of stages further includes:

a fifth capacitor having a first end connected to the third node and a second end connected to the first power source, and the fifth capacitor stores the voltage of the third node.

15. A driving method of a scan driver that includes a plurality of stages, comprising:

outputting, by the plurality of stages, a plurality of output signals in response to clock signals supplied at a first frequency during a driving time of one frame; and receiving, by the plurality of stages, the clock signals at a second frequency lower than the first frequency during a hold time of the one frame that is separate from the driving time of the one frame, wherein each of the plurality of stages includes:

an input portion controlling a voltage of a first node and a voltage of a second node based on signals supplied to a first input terminal and a second input terminal;

a first signal processing portion that supplies a voltage of a second power source to a fourth node based on the voltage of the first node, or electrically connects the second node and the fourth node through a fifth node based on a voltage of a first power source;

a second signal processing portion that includes a first transistor connected between a third node and a sixth node, and is connected to the first input terminal, the second input terminal, and the first power source to control a voltage of the third node based on an operation of the first transistor; and an output portion that controls a voltage applied to the third node to be less than or equal to the voltage of the first power source, and supplies the voltage of the first power source or the voltage of the second power source to an output terminal as a scan signal based on the voltage of the third node and a voltage of the fourth node.

16. The driving method of the scan driver of claim 15, wherein the stages do not output the plurality of output signals during the hold time of the one frame.

17. The driving method of the scan driver of claim 15, wherein the clock signals maintain a constant voltage level during the hold time of the one frame.

18. The driving method of the scan driver of claim 15, wherein the clock signals repeat a low voltage level and a high voltage level more than once during the hold time of the one frame.

* * * * *